(12) United States Patent
Ito et al.

(10) Patent No.: US 8,623,449 B2
(45) Date of Patent: Jan. 7, 2014

(54) METHOD FOR PRODUCING LAMINATED BASE MATERIAL

(75) Inventors: Toyonari Ito, Tsukuba (JP); Changbo Shim, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 191 days.

(21) Appl. No.: 13/167,892

(22) Filed: Jun. 24, 2011

(65) Prior Publication Data

US 2011/0315438 A1 Dec. 29, 2011

(30) Foreign Application Priority Data

Jun. 28, 2010 (JP) ................. P2010-146558
Mar. 30, 2011 (JP) ................. P2011-074432

(51) Int. Cl.
*B05D 5/12* (2006.01)

(52) U.S. Cl.
USPC ............ 427/97.1; 427/97.3; 427/98.4

(58) Field of Classification Search
USPC ............ 427/97.2–96.6, 97.3, 98.4, 97.1
See application file for complete search history.

(56) References Cited

U.S. PATENT DOCUMENTS

| | | | |
|---|---|---|---|
| 6,838,546 B2 * | 1/2005 | Okamoto et al. | 528/495 |
| 7,816,014 B2 * | 10/2010 | Ito et al. | 428/480 |
| 2007/0187643 A1 * | 8/2007 | Seo et al. | 252/299.01 |
| 2007/0293633 A1 * | 12/2007 | Hosoda et al. | 525/390 |

FOREIGN PATENT DOCUMENTS

| | | | |
|---|---|---|---|
| JP | 62-085941 A | | 4/1987 |
| JP | 2002146003 A | | 5/2002 |
| JP | 2002220444 A | | 8/2002 |
| JP | 2006-001990 | * | 1/2006 |
| JP | 2007-050576 A | | 3/2007 |
| JP | 2009-280831 A | | 12/2009 |
| JP | 2010-210768 | * | 9/2010 |
| JP | 2012-033869 | * | 2/2012 |

OTHER PUBLICATIONS

Koide, "Liquid Crystalline Polymer," CMC, Jun. 5, 1987, pp. 95-105 (English translation of relevant portion).

* cited by examiner

*Primary Examiner* — Brian K Talbot
(74) *Attorney, Agent, or Firm* — Panitch Schwarze Belisario & Nadel LLP

(57) ABSTRACT

A method for producing a laminated base material includes applying a liquid composition containing a solvent and a liquid crystal polyester to a substrate; and forming a covering material by removing the solvent. The substrate includes a conductor forming a circuit pattern on an insulating layer. The liquid composition covers the conductor. The polyester includes 30-50 mol % of (1), 25-35 mol % of (2), and 25-35 mol % of (3):

$$-O-Ar^1-OO- \quad (1)$$

$$-CO-Ar^2-OO- \quad (2)$$

$$-X-Ar^3-Y- \quad (3)$$

wherein $Ar^1$ is a phenylene or naphthylene group, $Ar^2$ is a phenylene or naphthylene group, or (4), $Ar^3$ is a phenylene group or (4), and X and Y each independently represent O or NH; and hydrogen atoms in $Ar^1$, $Ar^2$, or $Ar^3$ are each substitutable with a halogen atom, or an alkyl or aryl group;

$$-Ar^{11}-Z-Ar^{12}- \quad (4)$$

wherein $Ar^{11}$ and $Ar^{12}$ each independently represent a phenylene or naphthylene group and Z represents O, CO, or SO2.

3 Claims, 5 Drawing Sheets

METHOD FOR PRODUCING LAMINATED BASE MATERIAL

BACKGROUND OF THE INVENTION

1. Field of the Invention

The present invention relates to a method for producing a laminated base material composing a printed wiring board (printed board or printed circuit board) widely used in the electronic field.

2. Related Background Art

In commonly used conventional printed wiring boards of this type, a printed wiring board including a substrate which comprises an insulating layer and a conductor which is laminated on and forming a circuit pattern on the insulating layer, and a covering material laminated on the substrate for protecting the conductor. As the covering material, a base material of polyimide film having an adhesion layer of a thermoplastic resin such as thermoplastic polyimide on the back side is employed because of high heat resistance, practically high flow temperature, and no thermoplasticity (e.g., refer to Japanese Patent Application Laid-Open No. 62-85941).

However, the art disclosed in Patent Literature 1 causes increased transmission loss in electric signals under the influence of the adhesion layer (thermoplastic resin layer) described above to degrade electric characteristics of a printed wiring board in some instances, which requires improvement.

In view of these circumstances, it is a first object of the present invention to provide a laminated base material that can reduce transmission loss in electric signals and a method for producing the same, and it is a second object to provide a printed wiring board that can enhance electric characteristics.

SUMMARY OF THE INVENTION

In order to achieve the objects, the present inventors have focused on the use of a liquid crystal polyester having a specific skeleton (molecular structure) as principal raw material for covering material to reduce transmission loss in electric signals in the laminated base material, and completed the present invention.

The present invention provides a method for producing a laminated base material comprising a step of applying a liquid composition containing a solvent and a liquid crystal polyester to a substrate; and a step of forming a covering material by removing the solvent in the liquid composition; wherein the substrate comprises a insulating layer and a conductor laminated on the insulating layer, the conductor forms a circuit pattern on the insulating layer, the liquid composition is applied to the substrate such that the liquid composition covers the conductor in the applying step, and the liquid crystal polyester comprises 30 mol % to 50 mol % of the structural unit represented by formula (1), 25 mol % to 35 mol % of the structural unit represented by formula (2), 25 mol % to 35 mol % of the structural unit represented by formula (3), relative to a total content of all structural units;

—O—Ar$^1$—CO— (1)

—CO—Ar$^2$—CO— (2)

—X—Ar$^3$—Y— (3)

wherein Ar$^1$ represents a phenylene group or a naphthylene group, Ar$^2$ represents a phenylene group, a naphthylene group, or a group represented by formula (4), Ar$^3$ represents a phenylene group or a group represented by formula (4), and X and Y each independently represent O or NH; and hydrogen atoms belonging to the group represented by Ar$^1$, Ar$^2$, or Ar$^3$ may each be independently substituted with a halogen atom, an alkyl group, or an aryl group;

—Ar$^{11}$—Z—Ar$^{12}$— (4)

wherein Ar$^{11}$ and Ar$^{12}$ each independently represent a phenylene group or a naphthylene group and Z represents O, CO, or SO$_2$.

The present invention also provides a laminated base material produced by the method for producing the laminated base material.

Furthermore, the present invention provides a printed wiring board comprising the laminated base material and an electronic component mounted on the laminated base material.

Since the present invention uses a liquid crystal polyester having a specific skeleton as principal raw material for the covering material, a laminated base material having the covering material can reduce transmission loss in electric signals.

Also, electric characteristics of a printed wiring board can be enhanced by composing the printed wiring board with such a laminated base material.

BRIEF DESCRIPTION OF THE DRAWINGS

FIGS. 2(a) to 2(d) are process drawings illustrating a method for producing a laminated base material in accordance with the embodiment 1; FIG. 2(a) is a cross-sectional view illustrating a step of preparing a substrate; FIG. 2 (c) is a cross-sectional view illustrating a step of applying a composition; and FIG. 2 (d) is a cross-sectional view illustrating a step of forming a covering material;

FIGS. 4(a) to 4(d) are process drawings illustrating a method for producing a laminated base material in accordance with an embodiment 2; FIG. 4(a) is a cross-sectional view illustrating a step of preparing a substrate; FIG. 4 (c) is a cross-sectional view illustrating a step of applying a composition; and FIG. 4 (d) is a cross-sectional view illustrating a step of forming a covering material.

1 PRINTED WIRING BOARD
2 SUBSTRATE
3 INSULATING LAYER
4 CONDUCTOR
5 COVERING MATERIAL
6 LAMINATED BASE MATERIAL
7 ELECTRONIC COMPONENT
9 LIQUID COMPOSITION

DESCRIPTION OF THE PREFERRED EMBODIMENTS

Embodiments of the present invention are described below.

Embodiment 1 of the Present Invention

Figure 1:
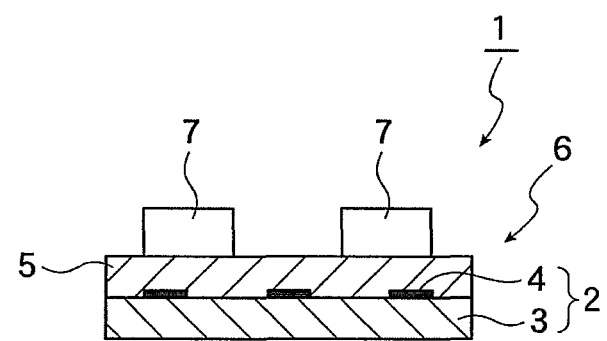
FIG. 1 is a cross-sectional view of a printed wiring board in accordance with an embodiment 1 of the present invention.
Figure 2:
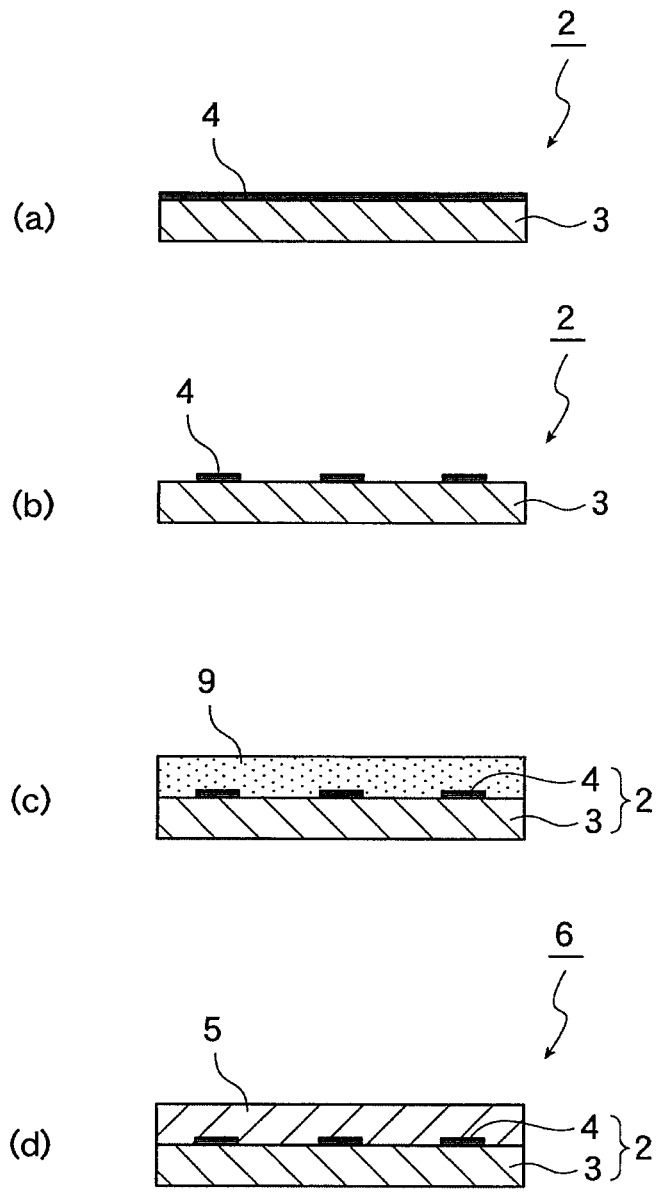
FIG. 2 (b) is a cross-sectional view illustrating a step of patterning.

FIG. 1 and FIG. 2 illustrate an embodiment 1 of the present invention. The dimensional ratio of each component is not exactly accurate in FIG. 1 and FIG. 2, with the emphasis on easy-to-understand illustration.

<Composition of Printed Wiring Board>

As shown in FIG. 1, a printed wiring board 1 in accordance with an embodiment 1 comprises a laminated base material 6 and one or more electronic components 7 such as an integrated circuit, a resistor, or a capacitor mounted on the front surface (the upper surface in FIG. 1) of the laminated base material 6. In FIG. 1, only two electronic components 7 are shown.

The laminated base material 6 has a substrate 2 as shown in FIG. 1. The substrate 2 comprises an insulating layer 3 composed of a liquid crystal polyester and a film shaped conductor 4 such as a copper foil laminated on and forming a circuit pattern on the front surface (the upper surface in FIG. 1) of the insulating layer 3. A covering material 5 composed of a liquid crystal polyester is laminated on the upper side of the substrate 2 (the upper side in FIG. 1) to cover the conductor 4.

Each of the liquid crystal polyester composing the insulating layer 3 and covering material 5 is polyester having characteristics exhibiting optical anisotropy in the molten state and forming anisotropic melt at a temperature of not higher than 450° C. The liquid crystal polyester for use in the present invention has a structural unit represented by formula (1) (hereinafter referred to as "formula (1) structural unit"), a structural unit represented by formula (2) (hereinafter referred to as "formula (2) structural unit"), and a structural unit represented by formula (3) (hereinafter referred to as "formula (3) structural unit"), with a content of the formula (1) structural unit of 30 mol % to 50 mol %, a content of the formula (2) structural unit of 25 mol % to 35 mol %, and a content of the formula (3) structural unit of 25 mol % to 35 mol %, relative to the total content of all structural units (a total of the content of each structural unit obtained as a substance quantity (mol) by dividing the mass of each structural unit composing the liquid crystal polyester by the formula weight of each structural unit):

  (1)

  (2)

  (3)

wherein $Ar^1$ represents a phenylene group or a naphthylene group, $Ar^2$ represents a phenylene group, a naphthylene group, or a group represented by formula (4), $Ar^3$ represents a phenylene group or a group represented by formula (4), and X and Y each independently represent O or NH; and hydrogen atoms belonging to the group represented by $Ar^1$, $Ar^2$, or $Ar^3$ may each be independently substituted with a halogen atom, an alkyl group, or an aryl group;

  (4)

wherein $Ar^{11}$ and $Ar^{12}$ each independently represent a phenylene group or a naphthylene group and Z represents O, CO, or $SO_2$.

The formula (1) structural unit is a structural unit derived from aromatic hydroxycarboxylic acid, of which examples include p-hydroxybenzoic acid, m-hydroxybenzoic acid, 2-hydroxy-6-naphthoic acid, 2-hydroxy-3-naphthoic acid, and 1-hydroxy-4-naphthoic acid.

The formula (2) structural unit is a structural unit derived from aromatic dicarboxylic acid, of which examples include terephthalic acid, isophthalic acid, 2,6-naphthalenedicarboxylic acid, 1,5-naphthalenedicarboxylic acid, diphenylether-4,4'-dicarboxylic acid, diphenylsulfone-4,4'-dicarboxylic acid, and diphenyl ketone-4,4'-dicarboxylic acid.

The formula (3) structural unit is a structural unit derived from aromatic diol or aromatic amine or aromatic diamine having a phenolic hydroxyl group. Examples of the aromatic diol include hydroquinone, resorcin, 2,2-bis(4-hydroxy-3,5-dimethylphenyl)propane, bis(4-hydroxyphenyl)ether, bis(4-hydroxyphenyl)ketone, bis(4-hydroxyphenyl)sulfone, and the like.

Examples of the aromatic amine having the phenolic hydroxyl group include p-aminophenol, 3-aminophenol, and etc., and examples of the aromatic diamine include 1,4-phenylenediamine and 1,3-phenylenediamine.

The liquid crystal polyester for use in the present invention is solvent-soluble, which means that it is soluble at a concentration of not lower than 1% by mass in solvent (medium) when a temperature of the solvent is 50° C. The solvent in this case is any one of solvents suitable for preparing a liquid composition to be described below and the details are described below.

Preferably the liquid crystal polyester having such solvent solubility contains a structural unit derived from aromatic amine and/or a structural unit derived from aromatic diamine having a phenolic hydroxyl group as the formula (3) structural unit. More specifically, it is preferred that the liquid crystal polyester comprises a structural unit wherein at least one of X and Y is NH as the formula (3) structural unit (hereinafter referred to as "formula (3') structural unit"), from the viewpoint that the solvent solubility in a favorable solvent (aprotic polar solvent) described below tends to be excellent. In particular, it is preferred that substantially all formula (3) structural units be the formula (3') structural units. Besides providing sufficient solvent solubility of the liquid crystal polyester, an advantageous effect of the formula (3') structural unit is that the liquid crystal polyester exhibits lower water absorption:

  (3')

wherein $Ar^a$ and X is as defined above.

Accordingly, the liquid crystal polyester having the formula (3') structural unit as formula (3) structural unit has advantageous effect that the covering material 5 using the liquid composition is more readily produced besides the solvent solubility and the low water absorption.

It is more preferred that the formula (1) structural unit be contained in the range of 32.5 mol % to 50 mol % relative to the total content of all structural units. The liquid crystal polyester containing the formula (1) structural unit at the mole fraction described above tends to achieve more excellent solvent solubility while sufficiently keeping the liquid crystallinity. With consideration for availability of aromatic hydroxycarboxylic acid from which the formula (1) structural unit is derived, preferably p-hydroxybenzoic acid and/or 2-hydroxy-6-naphthoic acid is used as the aromatic hydroxycarboxylic acid.

It is more preferred that the formula (2) structural unit be contained in the range of 25 mol % to 32.5 mol % relative to the total content of all structural units. The liquid crystal polyester containing the formula (2) structural unit at the mole fraction described above tends to achieve more excellent solvent solubility while sufficiently keeping the liquid crystallinity. In addition, with consideration for availability of aromatic dicarboxylic acid from which the formula (2) structural unit is derived, preferably the aromatic dicarboxylic acid is at least one selected from the group consisting terephthalic acid, isophthalic acid, and 2,6-naphthalenedicarboxylic acid.

It is more preferred that the formula (3) structural unit be contained in the range of 25 mol % to 32.5 mol % relative to the total content of all structural units to achieve more excellent solvent solubility.

Furthermore, in order to achieve high liquid crystallinity of the liquid crystal polyester to be produced, preferably a mole fraction of the formula (2) structural unit to the formula (3) structural unit represented by [formula (2) structural unit]/[formula (3) structural unit] is in the range of 0.9/1 to 1/0.9, more preferably in the range of 0.95/1 to 1/0.95, and furthermore preferably in the range of 0.98/1 to 1/0.98.

Next, a method for producing liquid crystal polyester is briefly described.

The liquid crystal polyester can be produced by various known methods. In the case that a preferred liquid crystal polyester having the formula (1) structural unit, formula (2) structural unit, and formula (3) structural unit is produced, a method for producing the liquid crystal polyester by transforming monomers, from which these structural units are to be derived, to ester forming or amide forming derivatives and then polymerizing the derivatives is preferred because of convenient operation.

The ester forming or amide forming derivatives will be described below with reference to examples.

Examples of the ester forming or amide forming derivative of a monomer having a carboxylic group such as aromatic hydroxycarboxylic acid or aromatic dicarboxylic acid include the ones having the carboxylic group with high reaction activity such as oxychloride or acid anhydride such that the reaction producing polyester or polyamide is enhanced, or such as the ones having the carboxylic group forming ester with alcohols, ethylene glycol, etc., such that polyester or polyamide is produced by ester exchange or amide exchange reaction.

Examples of the ester forming or amide forming derivative of a monomer having a phenolic hydroxyl group such as aromatic hydroxycarboxylic acid or aromatic dicarboxylic acid include such as the ones having the phenolic hydroxyl group forming ester with carboxylic acids such that polyester or polyamide is produced by ester exchange reaction.

Examples of the amide forming derivative of a monomer having an amino group such as aromatic diamine include such as the ones having the amino group forming amide with carboxylic acids such that polyamide is produced by amide exchange reaction.

In particular, it is specifically preferred to produce the liquid crystal polyester by acylating aromatic hydroxycarboxylic acid and a monomer having a phenolic hydroxyl group and/or an amino group such as aromatic diol, or aromatic amine or aromatic diamine having a phenolic hydroxyl group, with fatty acid anhydride, into an ester forming or an amide forming derivative (acylated product), and then by polymerizing the acyl group of the acylated product and the carboxylic group of the monomer having the carboxylic group such that ester exchange or amide exchange is occurred, to produce the liquid crystal polyester more conveniently.

The method for producing the liquid crystal polyester like this is described, for example, in Japanese Patent Application Laid-Open No. 2002-220444 or Japanese Patent Application Laid-Open No. 2002-146003.

In acylation, preferably the amount of addition of fatty acid anhydride is one to 1.2 times the equivalent amount of the total of the phenolic hydroxyl group and the amino group, more preferably 1.05 to 1.1 times the equivalent amount. With the amount of addition of fatty acid anhydride of less than one times the equivalent amount, the reaction system tends to be blocked due to sublimation of the acylated products or the source monomers during polymerization, while with the amount of addition of more than two times the equivalent amount, the produced liquid crystal polyester tends to exhibit notable coloration.

Preferably the acylation reaction is performed at 130° C. to 180° C. for 5 minutes to 10 hours, more preferably at 140° C. to 160° C. for 10 minutes to 3 hours.

From the viewpoints of cost and handling, the preferred fatty acid anhydride is acetic acid anhydride, propionic acid anhydride, butyric acid anhydride, isobutyric acid anhydride, or the mixture of at least two selected from these, and in particular acetic acid anhydride is preferred.

Polymerization after acylation is performed preferably at 130° C. to 400° C. with a temperature rising rate of 0.1° C./minute to 50° C./minute, more preferably at 150° C. to 350° C. with a temperature rising rate of 0.3° C./minute to 5° C./minute.

In polymerization, preferably the amount of the acyl group of acylated products is 0.8 to 1.2 times the equivalent amount of carboxylic groups.

During the acylation and/or polymerization, it is preferred that subgenerated fatty acids and unreacted fatty acid anhydride be distilled away from the system by evaporation, etc. in order to shift the equilibrium by Le Chatelier-Brown principle (principle of mobile equilibrium).

The acylation and/or polymerization may be performed in the presence of a catalyst. Conventionally known catalysts for polymerizing polyester may be used as the catalyst, of which examples include a metal salt catalyst such as magnesium acetate, stannous acetate, tetrabutyl titanate, lead acetate, sodium acetate, potassium acetate, or antimonous oxide; and an organic compound catalyst such as N,N-dimethylaminopyridine or N-methylimidazole.

In particular among these catalysts, a heterocyclic compound containing at least two nitrogen atoms such as N,N-dimethylaminopyridine, or N-methylimidazole is preferably used (refer to Japanese Patent Application Laid-Open 2002-146003).

This catalyst is usually fed together with monomers and needs not to be removed after acylation. In the case that this catalyst is not removed, acylation may proceed directly to polymerization.

Although the liquid crystal polyester produced by polymerization like this may be used without modification in the present invention, it is preferred to make molecular weight of the liquid crystal polyester higher in order to further enhance characteristics such as heat resistance and liquid crystallinity. Solid phase polymerization is preferred to achieve a higher molecular weight. A series of operations of the solid phase polymerization is described below. The liquid crystal polyester having relatively low molecular weight produced by the polymerization described above is taken out and crushed into powder or flakes. Subsequently, solid phase polymerization can be performed by heat-treating the crushed liquid crystal polyester, for example, under inert gas atmosphere such as nitrogen at 20° C. to 350° C. for one hour to 30 hours in the solid state. The solid phase polymerization may be performed with stirring or by standing still without stirring. In the viewpoint of obtaining a liquid crystal polyester having a preferred flow initiation temperature described below, the preferred conditions of the solid phase polymerization are specifically described as follows: preferred reaction temperature of higher than 210° C., more preferred range from 220° C. to 350° C. Preferably the reaction time is selected from one hour to 10 hours.

Preferably the liquid crystal polyester used in the present invention has a flow initiation temperature of not lower than 250° C., so that higher adhesion is achieved between the conductor 4 forming a wiring pattern and the covering material 5. The flow initiation temperature here also referred to as flow temperature is the temperature at which the liquid crystal polyester exhibits an viscosity of 4800 Pa·s (48000 poise) when melted by raising temperature at a rate of 4° C./min under a load of 9.8 MPa (100 kgf/cm$^2$) using a capillary rheometer and extruded from a nozzle with an inner diameter of 1 mm and a length of 10 mm, giving an indication of the molecular weight of the liquid crystal polyester (refer to "Liquid Crystal Polymers—Synthesis, Forming and Application" compiled by Naoyuki Koide, CMC Publishing Co., Ltd., Jun. 5, 1987, p. 95).

More preferably the liquid crystal polyester has a flow initiation temperature in the range of 250° C. to 300° C. When the flow initiation temperature is not higher than 300° C., the liquid crystal polyester has better solvent solubility and the produced liquid composition described below has viscosity that is not significantly large. Accordingly, easy handling of the liquid compound tends to be achieved. From the viewpoint, furthermore preferably the liquid crystal polyester has a flow initiation temperature in the range of 260° C. to 290° C. In order to control the flow initiation temperature of the liquid crystal polyester within such a preferred range, polymerization conditions for the solid phase polymerization is properly optimized.

<Liquid Composition>

In order to produce the laminated base material of the present invention, preferably a liquid composition containing a liquid crystal polyester and a solvent, or a liquid composition dissolving the liquid crystal polyester in solvent in particular is used. The liquid composition may be used as a raw material of the covering material or a raw material of the insulating layer as described below. In the present invention, when both of the insulating layer and the covering material are formed with the liquid composition, the liquid composition used for forming each of these may be the same or different. Still, from the viewpoint of enhancing adhesion of both, it is preferred that the same kind of liquid composition be used.

In the case of using the preferred liquid crystal polyester described above, or the liquid crystal polyester containing the formula (3') structural unit in particular as the liquid crystal polyester in the present invention, the liquid crystal polyester exhibits sufficient solubility in an aprotic solvent containing no halogen atom.

Examples of the aprotic solvent containing no halogen atom include an ether solvent such as diethyl ether, tetrahydrofuran, or 1,4-dioxane; a ketone solvent such as acetone or cyclohexanone; a ester solvent such as ethyl acetate; a lactone solvent such as γ-butyrolactone; a carbonate solvent such as ethylene carbonate or propylene carbonate; an amine solvent such as triethylamine or pyridine; a nitrile solvent such as acetonitrile or succinonitrile; an amide solvent such as N,N-dimethylformamide, N,N-dimethylacetoamide, tetramethylurea, or N-methylpyrolidone; a nitro solvent such as nitromethane or nitrobenzene; a sulfur solvent such as dimethyl sulfoxide or sulfolane; and a phosphorus solvent such as hexamethylphosphoric amide or tri-n-butyl phosphate. The solvent solubility of the liquid crystal polyester refers to solubility to at least one aprotic solvent selected from these.

In order to readily produce the liquid composition by further enhancing solvent solubility of the liquid crystal polyester, it is preferred to use an aprotic polar solvent having a dipole moment in the range of 3 to 5 among the exemplified solvents. Specifically, it is preferred to use an amide solvent or a lactone solvent and it is more preferred to use N,N-dimethylformamide (DMF), N,N-dimethylacetoamide (DMAc), or N-methylpyrolidone (NMP). In addition, when the solvent is highly volatile having a boiling point of not higher than 220° C. at one atmosphere, the solvent can be readily removed after application, which is an advantage. NMP or DMAc in particular is preferred in this view point. Furthermore, use of the amide solvent like this has an advantage that unevenness in thickness is reduced during production of the laminated base material.

Preferably the liquid composition contains 3 mass parts to 50 mass parts, preferably 8 mass parts to 30 mass parts of liquid crystal polyester relative to 100 mass parts of the solvent. In the case that the liquid crystal polyester content relative to the liquid composition is within such a range, the efficiency of impregnating the liquid composition into the substrate 2 is enhanced during production of the laminated base material 6. Consequently, the disadvantage that unevenness in thickness occurs during removal of the solvent by drying after application tends to be avoided.

In addition, at least one resin other than the liquid crystal polyester including a thermoplastic resin such as polypropylene, polyamide, polyester (i.e., non-liquid crystal polyallylate), polyphenylene sulfide, polyether ketone, polycarbonate, polyether sulfone, polyphenyl ether and a modified product thereof, and a thermoplastic resin such as polyether imide; an elastomer typified by a copolymer of glycidyl methacrylate and polyethylene; a thermosetting resin such as a phenol resin, an epoxy resin, a polyimide resin, and a cyanate resin may be added to the liquid composition within the range that does not impair the objects of the present invention. Still, in the case such other resin is used, it is preferred that the other resin be soluble to the solvent used for the liquid composition.

Furthermore, at least one kind of various additives including an inorganic filler such as silica, alumina, titanium oxide, barium titanate, strontium titanate, aluminum hydroxide, or calcium carbonate; an organic filler such as a cured epoxy resin, a cross-linked benzoguanamine resin, or a cross-linked acryl polymer; antioxidant; or an ultraviolet ray absorber may be added to the liquid composition for enhancing dimensional stability, thermal conductivity, and electric characteristics, within the range that does not impair the effects of the present invention.

Besides, fine foreign material contained in the liquid may be removed by filtering treatment using a filter from the liquid composition if needed.

In addition, defoaming treatment may be performed for the liquid composition, if needed.

<Method for Producing Base Material 2>

In the present invention, the laminated base material 6 is produced by a method comprising a step of applying a liquid composition containing a solvent and a liquid crystal polyester to a substrate 2; and a step of forming a covering material 5 by removing the solvent in the liquid composition; wherein the substrate 2 comprises a insulating layer 3 and a conductor 4 laminated on the insulating layer 3, the conductor 4 forms a circuit pattern on the insulating layer 3, and the liquid composition is applied to the substrate 2 such that the liquid composition covers the conductor 4 in the applying step. For example, in the case that the substrate 2 is produced by laminating the conductor 4 on the surface of the insulating layer 3 prepared by the liquid composition, it is preferred to form the insulating layer 3 by applying the liquid composition to the surface of the conductor 4 by a casting method, from a view point of achieving adhesion of the conductor 4 and the insulating layer 3. The casting method is described below.

In the casting method, after the liquid composition is applied onto the conductor 4, the solvent in the liquid composition is removed to form the insulating layer 3. Although the method for removing the solvent is not specifically limited, preferably the removal is performed by evaporating the solvent. The method for evaporating the solvent may be performed by heat treatment, decompression treatment, ventilation treatment, or a combination thereof. In particular, heat treatment is preferred with preferable temperature conditions in the range of about 80° C. to about 200° C. A proper time period for the heat treatment is about 10 minutes to about 120 minutes.

After the solvent is removed, performing of further heat treatment may reform the insulating layer 3. The reform has a purpose of controlling orientation of the liquid crystal polyester, and characteristics such as mechanical strength of the insulating layer 3 can be further enhanced by such a reform. The heat treatment for the reform has conditions in the preferred range of 250° C. to 350° C. with a preferred time period not exceeding 600 minutes. Preferably the heat treatment for the reform is performed under inert gas atmosphere such as nitrogen.

In certain instances, the insulating layer 3 may be further laminated with the conductor 4 on the surface having no laminated conductor 4 to produce the substrate 2 comprising the insulating layer 3 laminated with the conductor 4 on the front and the back surfaces thereof. For the further laminating of the conductor 4, the insulating layer 3 and the conductor 4 may be laminated by thermocompression bonding under inert gas atmosphere or vacuum atmosphere. The heating temperature for the thermocompression bonding is 150° C. to 370° C., preferably 250° C. to 350° C. Examples of the method for thermocompression bonding include thermal pressing method, continuous roll laminating method, and continuous belt pressing.

A fiber sheet impregnated with a liquid crystal polyester may be used as the insulating layer 3. The fiber sheet impregnated with a liquid crystal polyester can be produced, for example, by the method of impregnating the liquid composition into a fiber sheet and then removing the solvent form the liquid composition. This method is preferred, because the fiber sheet impregnated with a liquid crystal polyester can be produced, having strength that is hardly reduced even exposed to high moisture.

The examples of the fiber composing the fiber sheet include inorganic fiber such as glass fiber, carbon fiber, or ceramic fiber; and organic fiber such as polyester fiber including liquid crystal polyester fiber, aramid fiber, or polybenzazol fiber; and alternatively two or more kinds of these may be used. In particular, glass fiber is preferred.

Although the fiber sheet may be woven fabric (woven cloth), knit, or unwoven cloth, woven fabric is preferred because the dimensional stability of the fiber sheet impregnated with a liquid crystal polyester is readily enhanced.

The thickness of the fiber sheet is usually 10 μm to 200 μm, preferably 10 μm to 180 μm, and more preferably 10 μm to 100 μm.

In the method for producing the fiber sheet impregnated with a liquid crystal polyester, impregnation of the liquid crystal composition into the fiber sheet may be performed, for example, by immersing the fiber sheet into an immersion tank containing the liquid composition. Depending on the liquid crystal polyester content in the liquid composition, the amount of the liquid crystal polyester attached to the fiber sheet can be adjusted by properly controlling the period of time for immersing the fiber sheet or the rate of pulling the fiber sheet impregnated with the liquid composition up from the immersion tank. Preferably the attached amount of the liquid crystal polyester relative to the total mass of the fiber sheet impregnated with the liquid crystal polyester to be produced is 30% by mass to 80% by mass, more preferably 40% by mass to 70% by mass.

Subsequently, from the fiber sheet impregnated with the liquid composition, the fiber sheet impregnated with the liquid crystal polyester is produced by removing the solvent in the liquid composition. Preferably the removal of the solvent is performed by evaporating the solvent with a convenient operation, and examples of the method include heating, decompression, and ventilation, or may be a combination of these.

After the solvent is removed, heating treatment may be further performed, enabling production of the liquid crystal polyester with even higher molecular weight. The heat treatment is performed, for example, under inert gas atmosphere such as nitrogen, at 240° C. to 330° C., for one hour to 30 hours.

The fiber sheet impregnated with the liquid crystal polyester thus produced may be used as the insulating layer 3. A single sheet or more than one sheet of the fiber sheets impregnated with liquid crystal polyester may be used. For example, the substrate 2 may be produced by laminating the conductor 4 on the insulating layer 3 produced by laminating more than one sheet of the fiber sheets impregnated with liquid crystal polyester. Alternatively, the substrate 2 may be produced by laminating the conductor 4 on both sides of the fiber sheet impregnated with the liquid crystal polyester.

Examples of the method for laminating the conductor 4 on the insulating layer such as a fiber sheet impregnated with the liquid crystal polyester include a method for bonding a conductor such as a metal foil on the insulating layer with an adhesive and a method for fusion bonding by thermal pressing. Alternatively, the conductor may be formed by plating metal particulates, screen printing, sputtering, etc. on the insulating layer such as a fiber sheet impregnated with the liquid crystal polyester.

<Method for Producing Laminated Base Material>

Subsequently, a method for producing the laminated base material 6 in embodiment 1 is described with reference to FIG. 2.

In the present invention, a substrate comprising insulating layer and conductor laminated on and forming a circuit pattern on the insulating layer may be prepared, for example, by performing a substrate preparing step to be described below and then performing a patterning step, prior to performing the composition applying step and the covering material forming step. In the substrate preparing step, for example, as shown in FIG. 2 (a), the substrate 2 is prepared by laminating the conductor 4 on the front surface of the insulating layer 3.

In the patterning step, for example, as shown in FIG. 2(b), a circuit pattern is formed by the conductor 4. Specifically, for example, the conductor 4 is anticorrosion-treated in the necessary portion (portion where a circuit pattern is to be formed) and subject to the action of a corrosive agent for removing an unnecessary portion of the conductor 4.

In embodiment 1 of the present invention, in proceeding to the subsequent step of composition applying, a liquid composition 9 is applied on the front surface of the base material 2 such that the conductor 4 is covered as shown in FIG. 2(c). Specifically, for example, the liquid composition 9 produced by dissolving the liquid crystal polyester in solvent is filtered to remove fine foreign material contained in the liquid composition 9 using a filter if needed. Subsequently, the liquid composition 9 is flow casted on the substrate 2 evenly and uniformly by various methods such as roller coating, dip coating, spray coating, spinner coating, curtain coating, slot coating, or screen printing.

In the present invention, although the entire surface of the conductor 4 needs not to be covered with the liquid composition 9 when the composition applying step of applying the liquid composition 9 containing a solvent and a liquid crystal polyester on the substrate 2 including the insulating layer 3 and the conductor 4 is performed, it is preferred that the entire surface be covered. More specifically, preferably the entire surface of the conductor 4 other than the surface in contact with the insulating layer 3 is covered with the liquid composition 9 by performing the step of composition applying, because the insulation properties is enhanced with the liquid composition 9.

Finally, in proceeding to the step of forming covering material, the covering material 5 composed of a liquid crystal polyester is formed on the upper side of the substrate 2 as shown in FIG. 2(d) by removing the solvent in the liquid composition 9. Although the method of removing the solvent is not specifically limited, preferably the solvent is removed by evaporation. Although examples of the method for evaporating the solvent include methods such as heating, decompression, and ventilation, evaporation by heating in particular is preferred from the viewpoints of production efficiency and handling, and evaporation by heating with ventilation is more preferred. Preferably the heating conditions on this occasion comprise a step of preliminary drying at 60° C. to 200° C. for 10 minutes to 2 hours and a step of heat treatment at 200° C. to 400° C. for 30 minutes to 5 hours.

At this point, the laminated base material 6 comprising the substrate 2 and the covering material 5 reaches completion, and the production of the laminated base material 6 is concluded.

Since the laminated base material 6 thus produced has no adhesion layer, which is different from the art proposed in Japanese Patent Application Laid-Open No. 62-85941 described above (laminated base material composed of base material of polyimide film having an adhesion layer of thermoplastic resin such as thermoplastic polyimide on the back side thereof), transmission loss in electric signals can be reduced.

In addition, since the laminated base material 6 has a symmetrical structure where both sides of a copper foil pattern (conductor 4) are enclosed with liquid crystal polyester (insulating layer 3 and covering material 5) as described above, stress concentration is reduced to enhance flexibility. Since the insulating layer 3 is composed of also a liquid crystal polyester, an advantageous effect that transmission loss in electric signals can be further reduced is also achieved.

Embodiment 2 of the Present Invention

Figure 3:
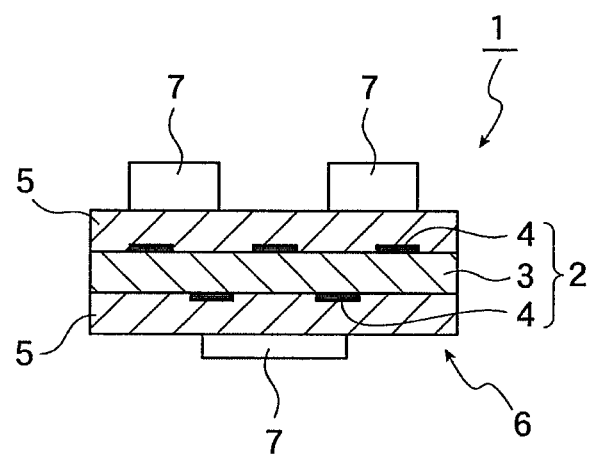
FIG. 3 is a cross-sectional view of a printed wiring board in accordance with an embodiment 2 of the present invention.
Figure 4:
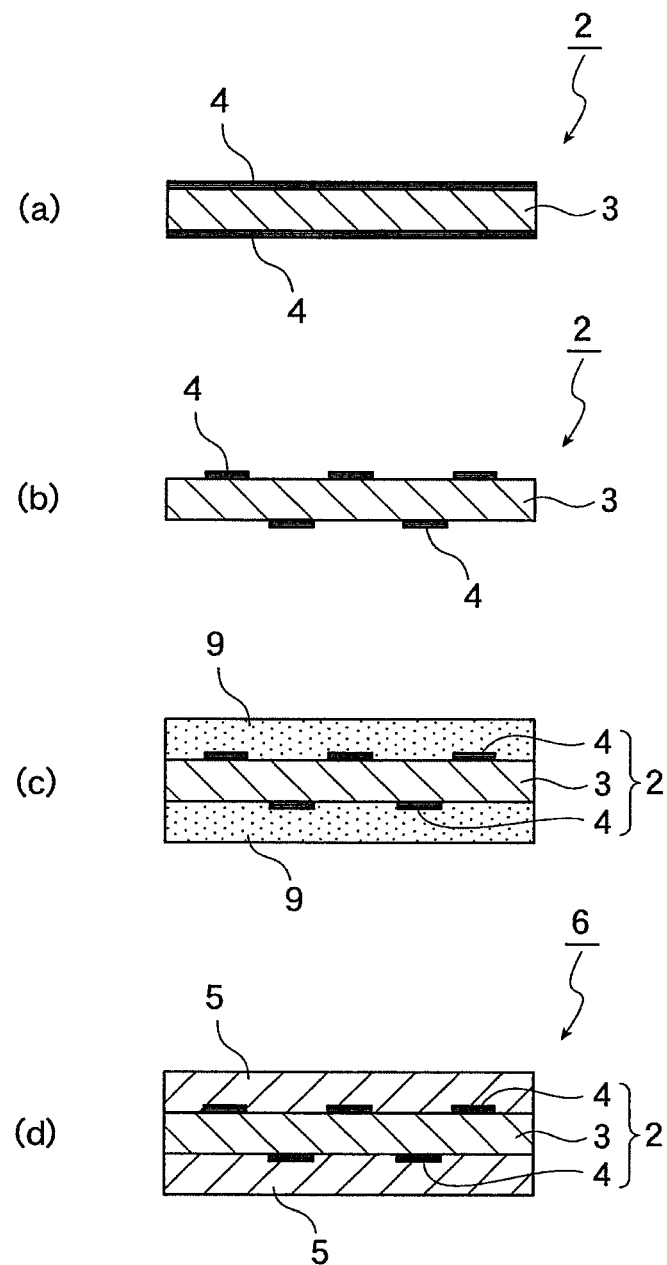
FIG. 4 (b) is a cross-sectional view illustrating a step of patterning.

FIG. 3 and FIG. 4 illustrate an embodiment 2 of the present invention. The dimensional ratio of each component is not exactly accurate in FIG. 3 and FIG. 4, with the emphasis on easy-to-understand illustration.

<Composition of Printed Wiring Board>
As shown in FIG. 3, a printed wiring board 1 in accordance with embodiment 2 comprises a laminated base material 6 and one or more electronic components 7 such as an integrated circuit, a resistor, or a capacitor mounted on both the front and back surfaces (both the upper and lower surfaces in FIG. 3) of the laminated base material 6. In FIG. 3, only three electronic components 7 are shown.

The laminated base material 6 has a substrate 2 as shown in FIG. 3. The substrate 2 comprises an insulating layer 3 composed of a liquid crystal polyester and a pair of film shaped conductors 4 and 4 such as copper foils laminated on and forming a circuit pattern on both the front and back surfaces (the upper and lower surfaces in FIG. 3) of the insulating layer 3. A pair of covering materials 5 and 5 composed of a liquid crystal polyester is laminated on both the front and back sides of the substrate 2 (the upper and lower sides in FIG. 3) to cover the conductors 4 and 4.

Each of the liquid crystal polyester composing the insulating layer 3 and each covering material 5 is similar to that in embodiment 1 described above.

<Method for Producing Laminated Base Material>
Subsequently, a method for producing the laminated base material 6 in embodiment 2 is described with reference to FIG. 4.

Firstly, in the substrate preparing step as shown in FIG. 4 (a), a substrate 2 is prepared by laminating the conductor 4 on both the front and back surfaces of the insulating layer 3.

Subsequently, in proceeding to the patterning step, circuit patterns are formed on the respective conductors 4 of the substrate 2 by following the same procedure as in embodiment 1, as shown in FIG. 4 (b).

Subsequently, in proceeding to the step of composition applying, the liquid composition 9 is applied on both the front and back surfaces of the substrate 2 such that the conductor 4 is covered by following the same procedure as in embodiment 1 described above, as shown in FIG. 4(c).

Finally, in proceeding to the step of forming covering material, the covering materials 5 composed of a liquid crystal polyester are formed on both the front and back sides of the substrate 2 as shown in FIG. 4(d) by removing the solvent in the respective liquid compositions 9, by following the same procedure as in embodiment 1.

At this point, the laminated base material 6 comprising the substrate 2 and a pair of the covering materials 5 reaches completion, and the production of the laminated base material 6 is concluded.

The laminated base material 6 thus produced provides the same operation and effect as in embodiment 1 described above.

Other Embodiment of the Present Invention

Although a printed wiring board 1 having electronic components 7 mounted on the front surface alone of the laminated base material 6 is described in embodiment 1 as shown in FIG. 1, the present invention may be alternatively applied to a printed wiring board 1 having electronic components 7 mounted on the respective both front and back surfaces (both the upper and lower surfaces in FIG. 1) of the laminated base material 6 in a similar way.

Although a printed wiring board 1 having electronic components 7 mounted on the respective both front and back surfaces of the laminated base material 6 is described in embodiment 2 as shown in FIG. 3, the present invention may be alternatively applied to a printed wiring board 1 having electronic components 7 mounted on one surface (the front surface or the back surface) alone.

EXAMPLES

Examples of the present invention are described below.
However, the present invention is not limited to the examples.

Production Example 1

Into a reactor vessel equipped with a stirring apparatus, a torque meter, a nitrogen gas inlet tube, a thermometer, and a reflux condenser, 941 g (5.0 mol) of 2-hydroxy-6-naphthoic acid, 466 g (2.5 mol) of 4,4'-dihydroxybiphenyl, 415 g (2.5 mol) of isophthalic acid, and 1123 g (11 mol) of acetic anhydride are fed. After the atmosphere in the reactor vessel was replaced with nitrogen gas, the temperature was raised to 140° C. under flowing nitrogen over a time period of 15 minutes, and kept at the temperature (140° C.) for 4 hours with stirring.

Subsequently, the temperature was raised to 320° C. over a time period of 170 minutes while subgenerated acetic acid and unreacted acetic anhydride were distilled away, and at the point when the torque uprose the content was taken out on the assumption that the reaction is complete. After the produced resin was crushed with a coarse crusher, solid phase polymerization was performed at 260° C. for 3 hours under nitrogen atmosphere to produce liquid crystal polyester powder.

Subsequently, 10 g of the liquid crystal polyester powder was added to 90 g of p-chlorophenol, and the mixture was heated at 120° C. for 8 hours to dissolve the liquid crystal polyester completely, resulting in the brown transparent liquid crystal polyester solution. The liquid crystal polyester solution was stirred, defoamed, applied to a rolled copper foil (conductor) available commercially (trade name: BHY-22B-T made by JX Nippon Mining & Metals Corporation, thickness of 18 μm) with a film applicator, and dried on a hot plate at 80° C. for 6 hours.

Subsequently, heat treatment was performed in a hot air oven under nitrogen gas atmosphere by raising temperature from 30° C. to 320° C. at a rate of temperature rise of 3.2° C./minute and keeping the temperature at 320° C. for 2 hours. When allowed to cool to room temperature, a one-side copper-clad laminated board A (laminated board composed of one insulating layer and one conductor layer) having a resin layer of 50 μm was produced. Subsequently, on the side of liquid crystal polyester of the one-side copper-clad laminated board A, a rolled copper foil (conductor) available commercially (trade name: BHY-22B-T made by JX Nippon Mining & Metals Corporation, thickness of 18 μm) was laminated to produce a both-side copper-clad laminated board A as a substrate by pressing from both sides with a maximum pressure of 5.0 MPa, at a holding temperature of 340° C., for a holding time of 30 minutes, using a high temperature vacuum press "KVHC-PRESS" (300 mm long and 300 mm wide) made by Kitagawa Seiki Co., Ltd.

Production Example 2

Into a reactor vessel equipped with a stirring apparatus, a torque meter, a nitrogen gas inlet tube, a thermometer, and a reflux condenser, 941 g (5.0 mol) of 2-hydroxy-6-naphthoic acid, 273 g (2.5 mol) of para-aminophenol, 415.3 g (2.5 mol) of isophthalic acid, and 1123 g (11 mol) of acetic anhydride are fed, and after the atmosphere in the reactor vessel was replaced with nitrogen gas, the temperature was raised to 150° C. under flowing nitrogen over a time period of 15 minutes, and kept at the temperature (150° C.) for 3 hours for refluxing. Subsequently, the temperature was raised to 320° C. over a time period of 170 minutes while subgenerated acetic acid and unreacted acetic anhydride were distilled away, and at the point when the torque uprose the content was taken out, then cooled to room temperature, and crushed with a coarse crusher to produce liquid crystal polyester powder. The liquid crystal polyester powder had a flow initiation temperature of 185° C. measured with a flow tester "CFT-500" made by Shimadzu Corporation. Subsequently, solid phase polymerization was performed by heat-treating the liquid crystal powder under nitrogen atmosphere at 255° C. for 3 hours. After the solid phase polymerization, the liquid crystal polyester powder had a flow initiation temperature of 320° C.

A liquid composition (solution of liquid crystal polyester in N-methylpyrolidone) was produced by adding 80 g of the liquid crystal polyester powder produced after solid phase polymerization as described above to 920 g of N-methylpyrolidone with heating at 140° C. for 4 hours for dissolving. The liquid composition had a viscosity of 530 cP measured at a measuring temperature of 23° C. using a B-type viscometer "TVL-20" made by Toki Sangyo Co., Ltd. (rotor No. 21, rotation speed: 5 rpm).

Production Example 3

Into a reactor vessel equipped with a stirring apparatus, a torque meter, a nitrogen gas inlet tube, a thermometer, and a reflux condenser, 1976 g (10.5 mol) of 2-hydroxy-6-naphthoic acid, 1474 g (9.75 mol) of 4-hydroxyacetanilide, 1620 g (9.75 mol) of isophthalic acid, and 2374 g (23.25 mol) of acetic anhydride are fed. After the atmosphere in the reactor vessel was sufficiently replaced with nitrogen gas, the temperature was raised to 150° C. under flowing nitrogen over a time period of 15 minutes, and kept at the temperature (150° C.) for 3 hours for refluxing.

Subsequently, the temperature was raised to 300° C. over a time period of 170 minutes while subgenerated acetic acid and unreacted acetic anhydride were distilled away, and at the point when the torque uprose the content was taken out on the assumption that the reaction was complete. After the content was cooled to room temperature and crushed with a crusher, liquid crystal polyester powder with relatively low molecular weight was produced. The liquid crystal polyester powder obtained had a flow initiation temperature of 235° C. measured with a flow tester "CFT-500" made by Shimadzu Corporation. Solid phase polymerization of the liquid crystal polyester was performed by heat-treating the liquid crystal powder under nitrogen atmosphere at 223° C. for 3 hours. After the solid phase polymerization, the liquid crystal polyester had a flow initiation temperature of 270° C.

A liquid composition was produced by adding 2200 g of the liquid crystal polyester produced as described above to 7800 g of N,N-dimethylacetoamide (DMAc) with heating at 100° C. for 2 hours. The liquid composition had a liquid viscosity of 200 cP. The melt viscosity was measured at a measuring temperature of 23° C. using a B-type viscometer "TVL-20" made by Toki Sangyo Co., Ltd. (rotor No. 21, rotation speed: 5 rpm).

Example 1

A circuit pattern having a length of 100 mm, a width of 95 μm, and a spacing of 70 μm was formed on only one side of the both-side copper-clad laminated board A produced in Production Example 1 by removing an unnecessary portion of the copper foil with etching using aqueous ferric chloride.

The liquid composition produced in Production Example 2 was applied to the surface of the substrate on the side having the circuit pattern using a bar coater so as to cover the circuit pattern.

Subsequently, heat treatment was performed in a hot air oven under nitrogen gas atmosphere by raising temperature from 30° C. to 280° C. at a rate of temperature rise of 3.2° C./minute and keeping the temperature at 280° C. for one hour to remove the solvent in the liquid composition, resulting in formation of a covering material composed of liquid crystal polyester.

The laminated base material was produced by the steps described above.

Example 2

A laminated base material was produced by the same operational procedures as in Example 1 with the exception of using a commercially available both-side copper-clad laminated board B (both-side copper-clad laminated board "BIAC (registered trademark)-BC" made by Japan Gore-Tex Inc.) instead of the both-side copper-clad laminated board A.

Example 3

A laminated base material was produced by the same operational procedures as in Example 1 with the exception of using a commercially available both-side copper-clad laminated board C (both-side copper-clad laminated board "FELIOS R-F705" made by Panasonic Electric Works Co., Ltd.) instead of the both-side copper-clad laminated board A.

Example 4

A laminated base material was produced by the same operational procedures as in Example 1 with the exception of using the liquid composition produced in Production Example 3 instead of the liquid composition produced in Production Example 2.

Example 5

A laminated base material is produced by the same operational procedures as in Example 1 with the exception of using the one-side copper-clad laminated board A instead of the both-side copper-clad laminated board A.

Comparative Example 1

A laminated base material was produced by the same operational procedures as in Example 1 with the exception of pressing a polyimide film having an adhesive layer "CISV 1225" made by Nikkan Industries Co., Ltd. under a maximum pressure of 4.0 MPa, at a holding temperature of 160° C., and for a holding time of 40 minutes using a high temperature vacuum press "KVHC-PRESS" (300 mm long and 300 mm wide) made by Kitagawa Seiki Co., Ltd. to a substrate of a printed wiring board to form a covering material, instead of applying liquid composition to the substrate and then removing the solvent.

Comparative Example 2

A laminated base material was produced by the same operational procedures as in Example 2 with the exception of pressing a polyimide film having an adhesive layer "CISV 1225" made by Nikkan Industries Co., Ltd. under a maximum pressure of 4.0 MPa, at a holding temperature of 160° C., and for a holding time of 40 minutes using a high temperature vacuum press "KVHC-PRESS" (300 mm long and 300 mm wide) made by Kitagawa Seiki Co., Ltd. to a substrate of a printed wiring board to form a covering material, instead of applying liquid composition to the substrate and then removing the solvent.

Comparative Example 3

A laminated base material was produced by the same operational procedures as in Example 3 with the exception of pressing a polyimide film having an adhesive layer "CISV 1225" made by Nikkan Industries Co., Ltd. under a maximum pressure of 4.0 MPa, at a holding temperature of 160° C., and for a holding time of 40 minutes using a high temperature vacuum press "KVHC-PRESS" (300 mm long and 300 mm wide) made by Kitagawa Seiki Co., Ltd. to a substrate of a printed wiring board to form a covering material, instead of applying liquid composition to the substrate and then removing the solvent.

Comparative Example 4

A laminated base material was produced by the same operational procedures as in Example 1 with the exception of pressing a film composed of the liquid crystal polyester used in Production Example 2 under a maximum pressure of 5.0 MPa, at a holding temperature of 340° C., and for a holding time of 30 minutes using a high temperature vacuum press "KVHC-PRESS" (300 mm long and 300 mm wide) made by Kitagawa Seiki Co., Ltd. to a substrate of a printed wiring board to form a covering material, instead of applying liquid composition to the substrate and then removing the solvent.

The film composed of the liquid crystal polyester used in Production Example 2 was produced as described below. The liquid composition produced in Production Example 2 was applied on a copper foil ("BHY-22B-T" made by JX Nippon Mining & Metals Corporation, thickness of 18 μm), dried at 100° C. for 30 minutes, and heat-treated under nitrogen atmosphere at 320° C. for 3 hours to produce a copper-clad laminated board. A film was produced by removing the copper foil from the copper-clad laminated board with etching using aqueous ferric chloride (Kida Co., Ltd: 40° Baume).

Example 6

A liquid composition was produced by adding silica ("MP-8FS" made by Tatsumori Ltd. (volume average grain diameter: 0.5 μm)) as a filler to the liquid composition produced in Production Example 3 and dispersing the silica with a centrifugal defoaming machine ("HM-500" made by Keyence Corporation). The amount of silica used was 20% by volume relative to the total amount of the liquid crystal polyester and silica. A glass cloth (glass cloth IPC 1078 made by Unitika Ltd.) was immersed in the liquid composition at 40° C. for one minute, dried at 100° C. for evaporating the solvent with a hot air drying machine, and subsequently heat-treated under nitrogen atmosphere at 290° C. for 3 hours with a hot air drying machine to produce an impregnated glass cloth substrate (attached amount: 56% by mass, thickness: 60 μm). Subsequently, two sheets of the impregnated glass cloth substrate were stacked and copper foils ("3EC-VLP" made by Mitsui Mining and Smelting Co., Ltd., (thickness: 18 μm)) were laminated on both sides. This was combined by thermally pressing with conditions at 340° C. under 5 MPa for 30 minutes using a high temperature vacuum press machine ("KVHC-PRESS" (300 mm long and 300 mm wide) made by Kitagawa Seiki Co., Ltd. to produce a both-side copper-clad laminated board D. A circuit pattern having a length of 100 mm, a width of 150 μm, and a spacing of 70 μm was formed on only one side of the both-side copper-clad laminated board D obtained by removing the unnecessary portion of the copper foil with etching using aqueous ferric chloride.

The liquid composition produced in Production Example 2 was applied to the circuit pattern thus produced using a bar coater.

Subsequently, heat treatment was performed in a hot air oven under nitrogen gas atmosphere by raising temperature from 30° C. to 270° C. at a rate of temperature rise of 3.2° C./minute and keeping the temperature at 270° C. for one hour to remove the solvent in the liquid composition, resulting in formation of a covering material composed of liquid crystal polyester.

The laminated base material was produced by the steps described above.

Comparative Example 5

A laminated base material was produced by the same operational procedures as in Example 6 with the exception of pressing a polyimide film having an adhesive layer "CISV 1225" made by Nikkan Industries Co., Ltd. under a maximum pressure of 4.0 MPa, at a holding temperature of 160° C., and for a holding time of 40 minutes using a high temperature vacuum press "KVHC-PRESS" (300 mm long and 300 mm wide) made by Kitagawa Seiki Co., Ltd. to a substrate of a printed wiring board to form a covering material, instead of applying liquid composition to the substrate and then removing the solvent.

<Measurement of Transmission Loss of Laminated Base Material>

Figure 5:
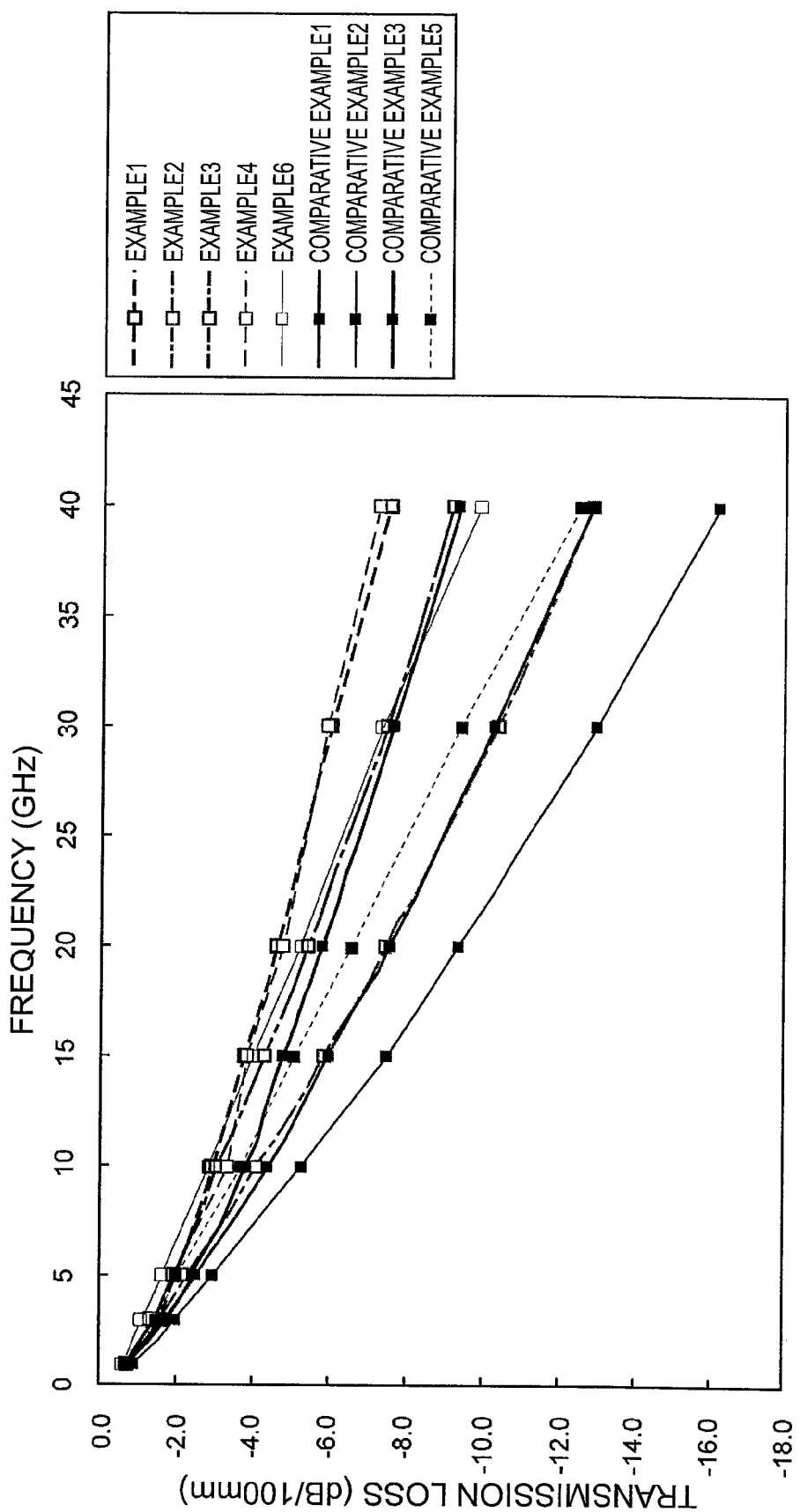
FIG. 5 is a graph illustrating transmission loss through a laminated base material at various frequencies.

The transmission loss of the laminated base material (S21 parameter) in each Example 1, Example 2, Example 3, Example 4, Example 6, Comparative Example 1, Comparative Example 2, Comparative Example 3, and Comparative Example 5 was measured with a measuring probe "E8363B" made by Agilent Technologies Japan, Ltd. The measurement was performed at eight levels of frequency: 1 GHz, 3 GHz, 5 GHz, 10 GHz, 15 GHz, 20 GHz, 30 GHz, and 40 GHz. The compiled results are shown in Table 1 and FIG. 5. In FIG. 5, the horizontal axis represents frequency (unit: GHz) and the vertical axis represents transmission loss (unit: dB/100 mm). In Comparative Example 4, it was found that the circuit pattern had not been sufficiently filled with resin from the observation of a cross-section of the laminated base material.

Example 1 and Comparative Example 1 have the same substrate and different covering materials, it is believed that the improvement in transmission loss results from the difference in covering material between the two (i.e., the latter is polyimide film having an adhesive layer while the former is liquid crystal polyester).

In comparison between Example 2 and Comparative Example 2, transmission loss was more reduced in the former than in the latter over the entire frequency band from 1 GHz to 40 GHz. Because Example 2 and Comparative Example 2 have the same substrate and different covering materials, it is believed that the improvement in transmission loss results from the difference in covering material between the two (i.e., the latter is polyimide film having an adhesive layer while the former is liquid crystal polyester).

In comparison between Example 3 and Comparative Example 3, transmission loss was more reduced in the former than in the latter over the entire frequency band from 1 GHz to 40 GHz. Because Example 3 and Comparative Example 3 have the same substrate and different covering materials, it is believed that the improvement in transmission loss results from the difference in covering material between the two (i.e., the latter is polyimide film having an adhesive layer while the former is liquid crystal polyester).

Furthermore, in comparison between Example 4 and Comparative Example 1, transmission loss was more reduced in the former than in the latter over the entire frequency band from 1 GHz to 40 GHz. Because Example 4 and Comparative Example 1 have the same substrate and different covering materials, it is believed that the improvement in transmission loss results from the difference in covering material between the two (i.e., the latter is polyimide film having an adhesive layer while the former is liquid crystal polyester).

Also, in comparison between Example 6 and Comparative Example 5, transmission loss was more reduced in the former than in the latter over the entire frequency band from 1 GHz

TABLE 1

| | | Example 1 | Example 2 | Example 3 | Example 4 | Example 6 | Comparative Example 1 | Comparative Example 2 | Comparative Example 3 | Comparative Example 4 | Comparative Example 5 |
|---|---|---|---|---|---|---|---|---|---|---|---|
| Substrate | | Both-side copper-clad laminated board A | Both-side copper-clad laminated board B | Both-side copper-clad laminated board C | Both-side copper-clad laminated board A | Both-side copper-clad laminated board D | Both-side copper-clad laminated board A | Both-side copper-clad laminated board B | Both-side copper-clad laminated board C | Both-side copper-clad laminated board A | Both-side copper-clad laminated board D |
| Covering material | | Production Example 2 | Production Example 2 | Production Example 2 | Production Example 3 | Production Example 2 | Polyimide film having adhesion layer | Polyimide film having adhesion layer | Polyimide film having adhesion layer | Liquid crystal polyester film | Polyimide film having adhesion layer |
| Transmission loss (dB) | 1 GHz | −0.74 | −0.75 | −0.72 | −0.69 | −0.54 | −0.82 | −0.89 | −0.87 | Difficulty in filling between circuits | −0.67 |
| | 3 GHz | −1.57 | −1.61 | −1.42 | −1.36 | −1.11 | −1.70 | −1.98 | −1.80 | | −1.45 |
| | 5 GHz | −2.01 | −2.34 | −1.96 | −1.91 | −1.61 | −2.43 | −2.94 | −2.53 | | −1.99 |
| | 10 GHz | −2.96 | −4.14 | −3.11 | −3.33 | −2.79 | −3.86 | −5.27 | −4.43 | | −3.65 |
| | 15 GHz | −3.79 | −5.92 | −4.33 | −3.83 | −3.97 | −4.81 | −7.48 | −6.00 | | −5.06 |
| | 20 GHz | −4.63 | −7.51 | −5.44 | −4.80 | −5.23 | −5.86 | −9.42 | −7.62 | | −6.56 |
| | 30 GHz | −6.08 | −10.46 | −7.56 | −5.98 | −7.35 | −7.70 | −13.02 | −10.37 | | −9.38 |
| | 40 GHz | −7.59 | −12.94 | −9.28 | −7.33 | −9.89 | −9.38 | −16.28 | −12.92 | | −12.48 |

As is evident from Table 1 and FIG. 5, a general predisposition was that transmission loss was reduced more in Examples 1 to 4 than in Comparative Examples 1 to 3 over the entire frequency band from 1 GHz to 40 GHz, or in particular over high frequency band.

More details are as follows. In comparison between Example 1 and Comparative Example 1, transmission loss was more reduced in the former than in the latter over the entire frequency band from 1 GHz to 40 GHz. Because to 40 GHz. Because Example 6 and Comparative Example 5 have the same substrate and different covering materials, it is believed that the improvement in transmission loss results from the difference in covering material between the two (i.e., the latter is polyimide film having an adhesive layer while the former is liquid crystal polyester).

The present invention can be widely applied to production of a laminated base material used for printed wiring boards, in particular for flexible wiring base boards.

What is claimed is:

1. A method for producing a laminated base material, comprising:

a step of applying a liquid composition containing an aprotic polar solvent and a liquid crystal polyester to a substrate; and a step of forming a covering material by removing the aprotic polar solvent in the liquid composition;

wherein the substrate comprises an insulating layer and a conductor laminated on the insulating layer, the conductor forms a circuit pattern on the insulating layer, the liquid composition is applied to the substrate in a manner such that the liquid composition covers the conductor in the applying step, and the liquid crystal polyester comprises 30 mol % to 50 mol % of the structural unit represented by formula (1), 25 mol % to 35 mol % of the structural unit represented by formula (2), and 25 mol % to 35 mol % of the structural unit represented by formula (3), relative to a total content of all structural units:

—O—Ar$^1$—CO— (1)

—CO—Ar$^2$—CO— (2)

—X—Ar$^3$—Y— (3)

wherein Ar$^1$ represents a phenylene group or a naphthalene group, Ar$^2$ represents a phenylene group, a naphthalene group, or a group represented by formula (4), Ar$^3$ represents a phenylene group or a group represented by formula (4), and X represents O and Y represents NH; and hydrogen atoms belonging to the group represented by Ar$^1$, Ar$^2$, or Ar$^3$ may each be independently substituted with a halogen atom, an alkyl group, or an aryl group;

—Ar$^{11}$—X—Ar$^{12}$— (4)

wherein Ar$^{11}$ and Ar$^{12}$ each independently represent a phenylene group or a naphthalene group and Z represents O, CO, or SO$_2$.

2. The method according to claim 1, wherein the insulating layer is composed of a liquid crystal polyester which is the same as or different from the liquid crystal polyester contained in the liquid composition.

3. The method according to claim 1, wherein the insulating layer is composed of a fiber sheet impregnated with a liquid crystal polyester which is the same as or different from the liquid crystal polyester contained in the liquid composition.

* * * * *